US010955455B2

United States Patent
Thompson et al.

(10) Patent No.: US 10,955,455 B2
(45) Date of Patent: Mar. 23, 2021

(54) BROKEN CONDUCTOR DETECTION AND REMEDIATION IN ELECTRIC POWER SYSTEMS

(71) Applicant: Schweitzer Engineering Laboratories, Inc., Pullman, WA (US)

(72) Inventors: John Thompson, Post Falls, ID (US); Mangapathirao Venkata Mynam, Pullman, WA (US)

(73) Assignee: Schweitzer Engineering Laboratories, Inc., Pullman, WA (US)

(*) Notice: Subject to any disclaimer, the term of this patent is extended or adjusted under 35 U.S.C. 154(b) by 335 days.

(21) Appl. No.: 15/959,053

(22) Filed: Apr. 20, 2018

(65) Prior Publication Data

US 2019/0324074 A1 Oct. 24, 2019

(51) Int. Cl.
*G01R 31/08* (2020.01)
*H02H 7/26* (2006.01)
*H02H 5/10* (2006.01)

(52) U.S. Cl.
CPC .......... *G01R 31/086* (2013.01); *H02H 5/10* (2013.01); *H02H 7/26* (2013.01)

(58) Field of Classification Search
CPC .......... G01R 31/08–086; G01R 31/52; G01R 31/54; H02H 3/042
See application file for complete search history.

(56) References Cited

U.S. PATENT DOCUMENTS

| 3,970,898 | A | * | 7/1976 | Baumann | ............... | H02H 7/262 |
| | | | | | | 361/68 |
| 6,205,867 | B1 | | 3/2001 | Hayes | | |
| 8,797,018 | B2 | * | 8/2014 | Watkins | ................. | G01R 29/18 |
| | | | | | | 324/66 |
| 2009/0243876 | A1 | | 10/2009 | Lilien | | |
| 2012/0029871 | A1 | | 2/2012 | Spillane | | |
| 2012/0068717 | A1 | * | 3/2012 | Gong | .................. | G01R 31/085 |
| | | | | | | 324/522 |
| 2013/0205900 | A1 | | 8/2013 | Nulty | | |
| 2014/0104738 | A1 | * | 4/2014 | Schweitzer, III | ........ | H02H 3/08 |
| | | | | | | 361/87 |
| 2014/0136140 | A1 | | 5/2014 | Chan | | |

(Continued)

FOREIGN PATENT DOCUMENTS

WO 2006050156 5/2006

*Primary Examiner* — Gustavo A Rosario-Benitez
(74) *Attorney, Agent, or Firm* — Jared L. Cherry

(57) ABSTRACT

The present disclosure pertains to detection of a broken conductor in an electric power system. In one embodiment, a broken conductor detector may be configured to be mounted to an electrical conductor and may comprise a communication subsystem configured to transmit a signal configured to indicate that the conductor is broken. A sensor may determine an operating vector. A processing subsystem may be configured to receive the operating vector from the sensor and to identify when the operating vector is outside of a range defined by a rest vector and a threshold value. In certain embodiments, the threshold may comprise a three-dimensional sphere. The processing subsystem may determine that the conductor is broken based on the operating vector remaining outside of the range for a period of time determined by the timer subsystem. A signal may be transmitted by the communication subsystem to indicate that the conductor is broken.

11 Claims, 6 Drawing Sheets

(56) References Cited

U.S. PATENT DOCUMENTS

| | | | |
|---|---|---|---|
| 2016/0363621 A1* | 12/2016 | Kalokitis | G01R 15/24 |
| 2017/0350932 A1* | 12/2017 | Wang | G01R 31/085 |
| 2018/0156145 A1* | 6/2018 | Clark | F02D 41/042 |
| 2018/0233895 A1* | 8/2018 | O'Regan | H02J 13/0004 |
| 2019/0162772 A1* | 5/2019 | Berrabah | G01R 27/06 |
| 2019/0327124 A1* | 10/2019 | Lai | H04L 27/362 |

* cited by examiner

BROKEN CONDUCTOR DETECTION AND REMEDIATION IN ELECTRIC POWER SYSTEMS

TECHNICAL FIELD

This disclosure relates to systems and methods for detecting broken or downed electrical power lines. The detection of a broken or downed power line may be used to select an appropriate control strategy in response.

BRIEF DESCRIPTION OF THE DRAWINGS

Non-limiting and non-exhaustive embodiments of the disclosure are described, including various embodiments of the disclosure with reference to the figures, in which.

DETAILED DESCRIPTION

Figure 1:
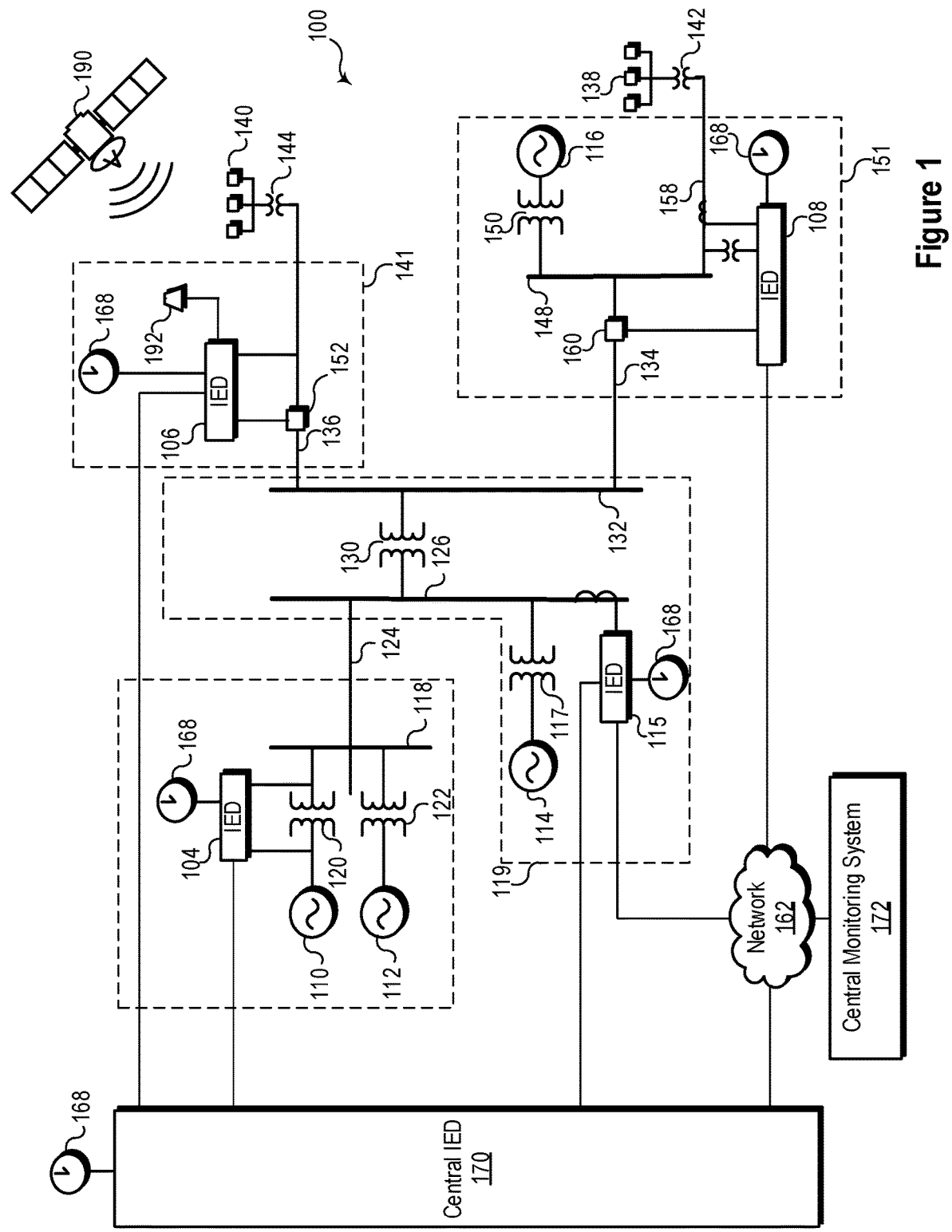
FIG. 1 illustrates an example of an embodiment of a simplified one-line diagram of an electric power delivery system with various substations consistent with embodiments of the present disclosure.

Electrical power systems commonly use conductors suspended between pylons to transmit and distribute electrical power. These conductors may be damaged by a wide variety of circumstances ranging from weather, to traffic accidents, to vandalism. Broken or downed electrical conductors may cause fires, hazardous conditions, and may disrupt electrical service. Accordingly, the detection of broken or downed electrical conductors may reduce risk to persons and property, and further, may be an important step in repairing the electrical power system.

Systems and methods consistent with the present disclosure may utilize broken conductor detectors consistent with the present disclosure. In various embodiments, the broken conductor detectors may be suspended from conductors in an electrical power system in a span between two pylons. Such detectors may monitor the orientation of the device and may determine whether the conductor is broken or downed based on the orientation of the device.

In some embodiments, broken conductor detectors consistent with the present disclosure may communicate wirelessly with a control system. The control system may utilize the information generated by broken conductor detectors to identify an appropriate control strategy in response to the broken conductor. For example, a broken conductor may be de-energized by the control system to reduce the risk of injury to persons and property in the vicinity of the broken conductor. Still further, the identification of a downed power line may be used to minimize the disruption of electrical service by permitting identification of the smallest possible area of the electric power system to be de-energized due to the broken conductor.

In some electrical power systems, multiple attempts to reenergize a power line may be made following a trip to address transient conditions (e.g., a fault caused by a temporary gust of wind). In various embodiments consistent with the present disclosure, detection of a broken conductor may block re-energization. Attempts to re-energize a broken conductor may result in electrical arching, which could cause a fire, or create other types of hazardous conditions.

The embodiments of the disclosure will be best understood by reference to the drawings. It will be readily understood that the components of the disclosed embodiments, as generally described and illustrated in the figures herein, could be arranged and designed in a wide variety of different configurations. Thus, the following detailed description of the embodiments of the systems and methods of the disclosure is not intended to limit the scope of the disclosure, as claimed, but is merely representative of possible embodiments of the disclosure. In addition, the steps of a method do not necessarily need to be executed in any specific order, or even sequentially, nor do the steps need be executed only once, unless otherwise specified.

In some cases, well-known features, structures, or operations are not shown or described in detail. Furthermore, the described features, structures, or operations may be combined in any suitable manner in one or more embodiments. It will also be readily understood that the components of the embodiments, as generally described and illustrated in the figures herein, could be arranged and designed in a wide variety of different configurations. For example, throughout this specification, any reference to "one embodiment," "an embodiment," or "the embodiment" means that a particular feature, structure, or characteristic described in connection with that embodiment is included in at least one embodiment. Thus, the quoted phrases, or variations thereof, as recited throughout this specification are not necessarily all referring to the same embodiment.

Several aspects of the embodiments disclosed herein may be implemented as software modules or components. As used herein, a software module or component may include any type of computer instruction or computer executable code located within a memory device that is operable in conjunction with appropriate hardware to implement the programmed instructions. A software module or component may, for instance, comprise one or more physical or logical blocks of computer instructions, which may be organized as a routine, program, object, component, data structure, etc., that performs one or more tasks or implements particular abstract data types.

In certain embodiments, a particular software module or component may comprise disparate instructions stored in different locations of a memory device, which together implement the described functionality of the module. Indeed, a module or component may comprise a single instruction or many instructions, and may be distributed over several different code segments, among different programs, and across several memory devices. Some embodiments may be practiced in a distributed computing environment where tasks are performed by a remote processing device linked through a communications network. In a distributed computing environment, software modules or components may be located in local and/or remote memory storage devices. In addition, data being tied or rendered together in a database record may be resident in the same memory device, or across several memory devices, and may be linked together in fields of a record in a database across a network.

Embodiments may be provided as a computer program product including a non-transitory machine-readable medium having stored thereon instructions that may be used to program a computer or other electronic device to perform processes described herein. The non-transitory machine-readable medium may include, but is not limited to, hard drives, floppy diskettes, optical disks, CD-ROMs, DVD-ROMs, ROMs, RAMs, EPROMs, EEPROMs, magnetic or optical cards, solid-state memory devices, or other types of media/machine-readable media suitable for storing electronic instructions. In some embodiments, the computer or other electronic device may include a processing device such as a microprocessor, microcontroller, logic circuitry, or the like. The processing device may further include one or more special purpose processing devices such as an application specific interface circuit (ASIC), PAL, PLA, PLD, field programmable gate array (FPGA), or any other customizable or programmable device.

Electrical power generation and delivery systems are designed to generate, transmit, and distribute electrical energy to loads. Electrical power generation and delivery systems may include equipment, such as electrical generators, electrical motors, power transformers, power transmission and distribution lines, circuit breakers, switches, buses, transmission lines, voltage regulators, capacitor banks, and the like. Such equipment may be monitored, controlled, automated, and/or protected using intelligent electronic devices (IEDs) that receive electric power system information from the equipment, make decisions based on the information, and provide monitoring, control, protection, and/or automation outputs to the equipment.

In some embodiments, an IED may include, for example, remote terminal units, differential relays, distance relays, directional relays, feeder relays, overcurrent relays, voltage regulator controls, voltage relays, breaker failure relays, generator relays, motor relays, automation controllers, bay controllers, meters, recloser controls, communication processors, computing platforms, programmable logic controllers (PLCs), programmable automation controllers, input and output modules, governors, exciters, statcom controllers, static VAR compensator (SVC) controllers, on-load tap changer (OLTC) controllers, and the like. Further, in some embodiments, IEDs may be communicatively connected via a network that includes, for example, multiplexers, routers, hubs, gateways, firewalls, and/or switches to facilitate communications on the networks, each of which may also function as an IED. Networking and communication devices may also be integrated into an IED and/or be in communication with an IED. As used herein, an IED may include a single discrete IED or a system of multiple IEDs operating together.

FIG. 1 illustrates a simplified one-line diagram of an electric power transmission and distribution system 100 configured to utilize one or more secondary time sources to verify the accuracy of a primary time source consistent with embodiments of the present disclosure. Electric power delivery system 100 may be configured to generate, transmit, and distribute electric energy to loads. Electric power delivery systems may include equipment, such as electric generators (e.g., generators 110, 112, 114, and 116), power transformers (e.g., transformers 117, 120, 122, 130, 142, 144 and 150), power transmission and delivery lines (e.g., lines 124, 134, 136, and 158), circuit breakers (e.g., breakers 152, 160), busses (e.g., busses 118, 126, 132, and 148), loads (e.g., loads 140, and 138) and the like. A variety of other types of equipment may also be included in electric power delivery system 100, such as voltage regulators, capacitor banks, and a variety of other types of equipment.

Substation 119 may include a generator 114, which may be a distributed generator, and which may be connected to bus 126 through step-up transformer 117. Bus 126 may be connected to a distribution bus 132 via a step-down transformer 130. Various distribution lines 136 and 134 may be connected to distribution bus 132. Distribution line 136 may lead to substation 141 where the line is monitored and/or controlled using IED 106, which may selectively open and close breaker 152. Load 140 may be fed from distribution line 136. Further step-down transformer 144 in communication with distribution bus 132 via distribution line 136 may be used to step down a voltage for consumption by load 140.

Distribution line 134 may lead to substation 151, and deliver electric power to bus 148. Bus 148 may also receive electric power from distributed generator 116 via transformer 150. Distribution line 158 may deliver electric power from bus 148 to load 138, and may include further step-down transformer 142. Circuit breaker 160 may be used to selectively connect bus 148 to distribution line 134. IED 108 may be used to monitor and/or control circuit breaker 160 as well as distribution line 158.

Electric power delivery system 100 may be monitored, controlled, automated, and/or protected using intelligent electronic devices (IEDs), such as IEDs 104, 106, 108, 115, and 170, and a central monitoring system 172. In general, IEDs in an electric power generation and transmission system may be used for protection, control, automation, and/or monitoring of equipment in the system. For example, IEDs may be used to monitor equipment of many types, including electric transmission lines, electric distribution lines, current transformers, busses, switches, circuit breakers, reclosers, transformers, autotransformers, tap changers, voltage regulators, capacitor banks, generators, motors, pumps, compressors, valves, and a variety of other types of monitored equipment.

As used herein, an IED (such as IEDs 104, 106, 108, 115, and 170) may refer to any microprocessor-based device that monitors, controls, automates, and/or protects monitored equipment within system 100. Such devices may include, for example, remote terminal units, differential relays, distance relays, directional relays, feeder relays, overcurrent relays, voltage regulator controls, voltage relays, breaker failure relays, generator relays, motor relays, automation controllers, bay controllers, meters, recloser controls, communications processors, computing platforms, programmable logic controllers (PLCs), programmable automation controllers, input and output modules, and the like. The term IED may be used to describe an individual IED or a system comprising multiple IEDs.

Central monitoring system 172 may comprise one or more of a variety of types of systems. For example, central monitoring system 172 may include a supervisory control and data acquisition (SCADA) system and/or a wide area control and situational awareness (WACSA) system. A central IED 170 may be in communication with IEDs 104, 106, 108, and 115. IEDs 104, 106, 108 and 115 may be remote from the central IED 170, and may communicate over various media such as a direct communication from IED 106 or over a wide-area communications network 162. According to various embodiments, certain IEDs may be in direct communication with other IEDs (e.g., IED 104 is in direct communication with central IED 170) or may be in communication via a communication network 162 (e.g., IED 108 is in communication with central IED 170 via communication network 162).

In various embodiments, IEDs 104, 106, 108, 115, and 170 may be configured to monitor the frequency of alternating current waveforms, voltage levels, or other electrical conditions in system 100. Network 162 may be used to transmit information among various components in system 100, including IEDs 108, 115, 170, and central monitoring system 172. In various embodiments, network 162 may be configured to provide streaming measurements that may be analyzed consistent with the present disclosure to detect anomalies.

A common time signal 168 may be used to time-align measurements for comparison and/or to synchronize action across system 100. Utilizing a common or universal time source may ensure that IEDs have a synchronized time signal that can be used to generate time synchronized data, such as synchrophasors. In various embodiments, the common time source may comprise a time signal from a GNSS system 190. IED 106 may include a receiver 192 configured to receive the time signal from the GNSS system 190. In various embodiments, IED 106 may be configured to distribute the time signal to other components in system 100, such as IEDs 104, 108, 115, and 170.

Overhead conductors or powerlines may be used to transmit and/or distribute power in system 100. Broken or downed conductors or powerlines may disrupt electrical service to one or more loads 138, 140. In addition to causing disruptions of electrical service, downed power lines may pose a risk to persons or property in proximity to system 100. Detection of broken conductors may reduce the risk of injury to persons or damage to property and may also help to expedite repair of the broken conductor.

Figure 2:
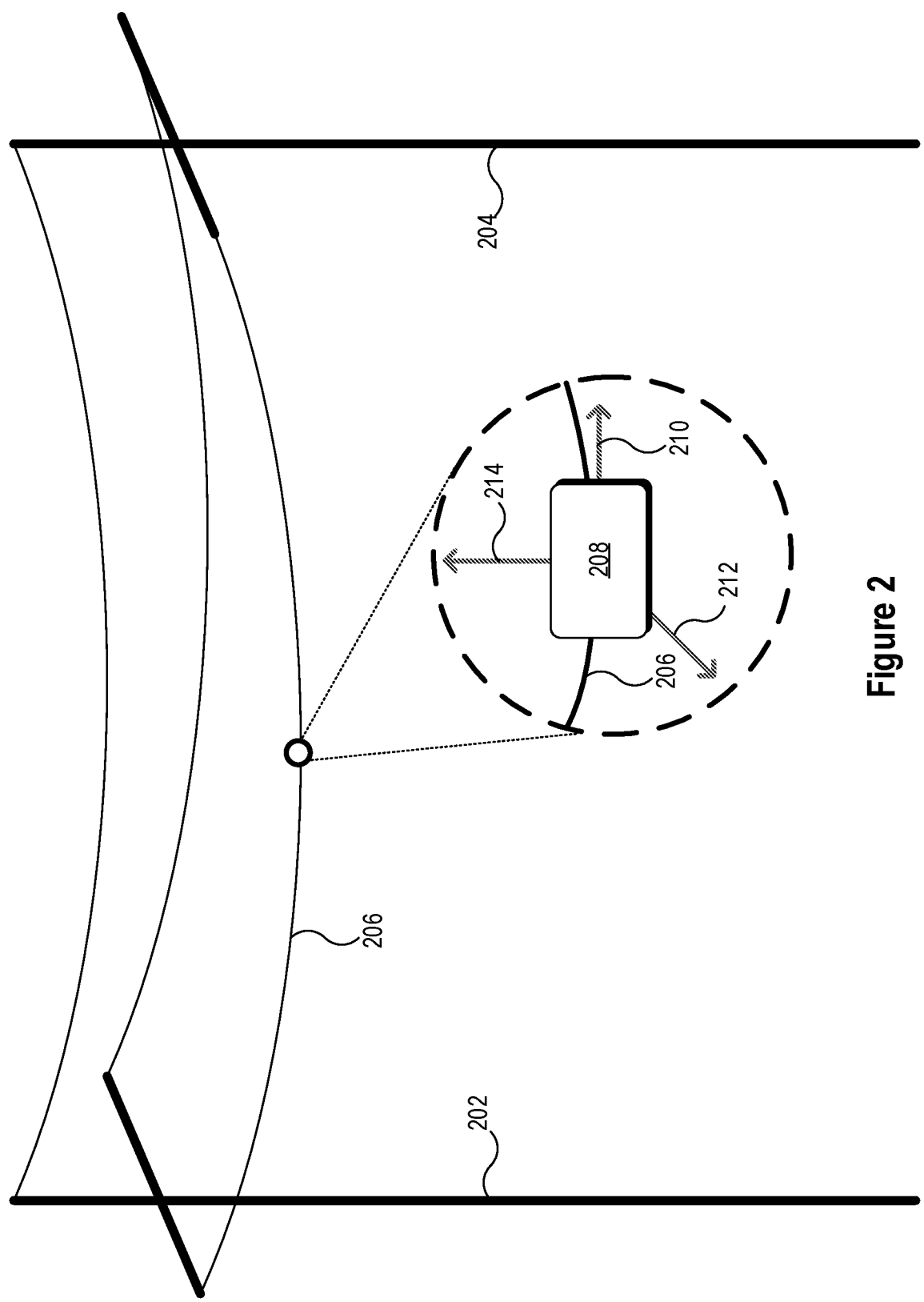
FIG. 2 illustrates a simplified representation of a single-span broken conductor detector consistent with embodiments of the present disclosure.

FIG. 2 illustrates a simplified representation of a single-span broken conductor detector 208 consistent with embodiments of the present disclosure. In the illustrated embodiment, a conductor 206 is strung between pylon 202 and pylon 204. A broken conductor detector 208 is affixed to conductor 206. The broken conductor detector 208 may monitor acceleration and/or orientation in three dimensions. In the illustrated embodiment, the broken conductor detector 208 may monitor its acceleration and/or orientation with respect to an x-axis 210, a y-axis 214, and a z-axis 212. In some embodiments, a two-dimensional rotation and/or acceleration sensor may be utilized.

The rotational position and acceleration of the broken conductor detector 208 may be affected by breakage of the conductor 206. When the conductor breaks, the broken conductor detector 208 may detect acceleration as the conductor 206 falls to the ground. In various embodiments, the broken conductor detector 208 may be initialized upon installation and may compare future measurements of rotation to the initialized values. The rotational position of the broken conductor detector 208 may be affected by breakage of the conductor 206, and accordingly, changes in the rotational position of the broken conductor detector 208 may provide an indication that the conductor 206 is broken. As illustrated in FIG. 2, the broken conductor detector 208 is oriented approximately parallel to the ground. If the conductor falls away from one of pylons 202 and 204, the broken conductor detector 208 may be oriented more perpendicularly to the ground in comparison to the position illustrated in FIG. 2.

In various embodiments consistent with the present disclosure, broken conductor detector 208 may include a timer that may be used to detect transient conditions. Conductor 206 may be subject to environmental factors (e.g, wind) that may cause the conductor 206 to move without breaking. The timer may be used to determine the period of time that changes persist in the rotational position and/or acceleration. In some embodiments, the period of time during which the changes are detected may be used to differentiate between transient conditions (e.g., strong wind gusts) and permanent conditions (e.g., a broken conductor).

Figure 3A:
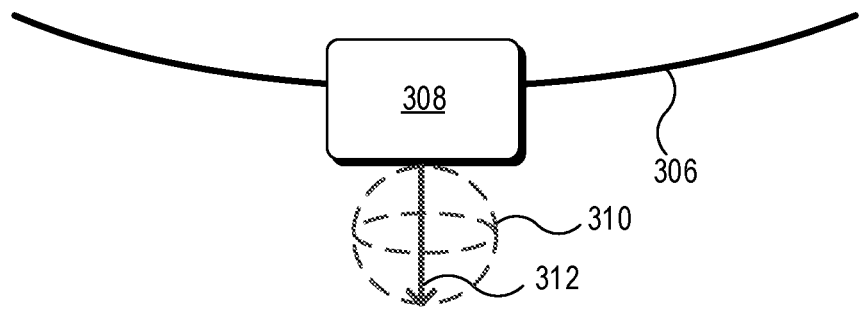
FIG. 3A illustrates a simplified representation of a broken conductor detector associated with an orientation vector within a three-dimensional orientation threshold consistent with embodiments of the present disclosure.

FIG. 3A illustrates a simplified representation of a broken conductor detector 308 associated with an orientation vector 312 within a three-dimensional representation of an orientation threshold 310 consistent with embodiments of the present disclosure. As illustrated in FIG. 3A, the orientation vector 312 may be disposed within an orientation threshold 310. In the illustrated embodiment, the orientation threshold 310 comprises a sphere. In other embodiments, the orientation threshold 310 may be embodied in a variety of ways. For example, the orientation threshold 310 may be embodied as a cone or other geometric shape, using specific angular thresholds, and/or using acceleration thresholds.

The orientation vector 312 may be initialized when the broken conductor detector 308 is installed on a conductor 306. In the illustrated embodiment, the orientation vector 312 is oriented perpendicularly to a bottom surface of the broken conductor detector 308. As may be appreciated, the orientation vector 312 may remain within the orientation threshold 310 while the conductor remains stationary.

Figure 3B:
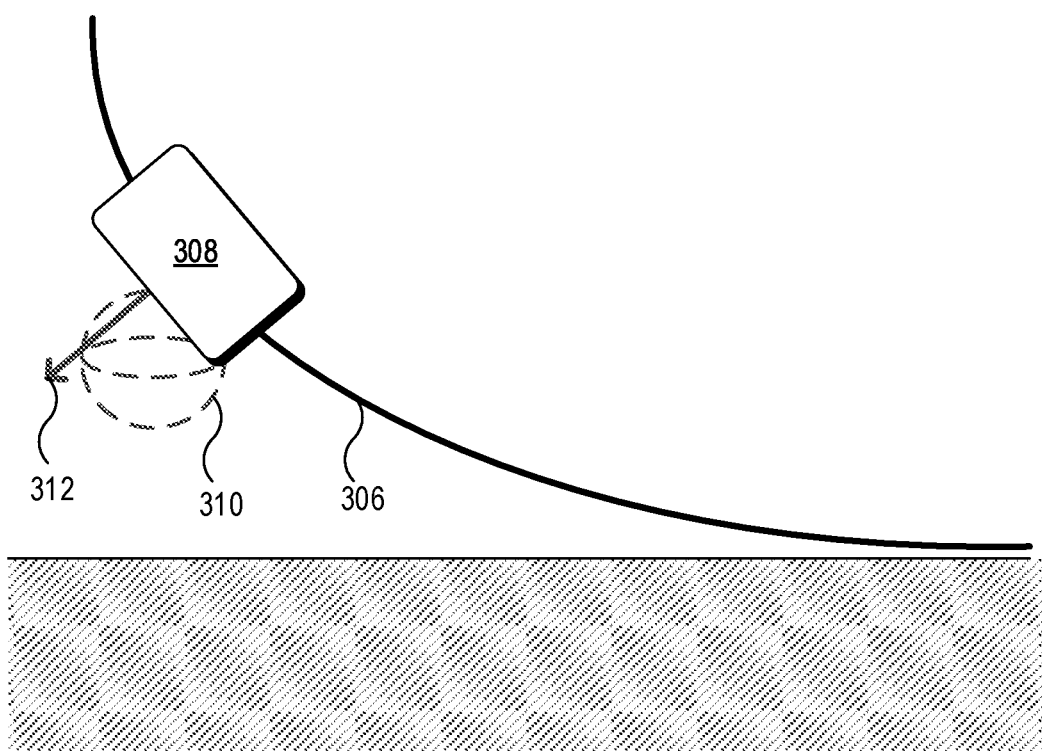
FIG. 3B illustrates the broken conductor detector of FIG. 3A in which the electrical conductor, to which the broken conductor detector is affixed, is broken and the orientation vector is outside of a three-dimensional orientation threshold consistent with embodiments of the present disclosure.

FIG. 3B illustrates the broken conductor detector 308 of FIG. 3A in which the electrical conductor 306, to which the broken conductor detector 308 is affixed, is broken and the orientation vector 312 is outside of a three-dimensional orientation threshold 310 consistent with embodiments of the present disclosure. The orientation vector 312 and the orientation threshold 310 in FIG. 3B remain in the same positions with respect to the broken conductor detector 308 as shown in FIG. 3A. Due to the change in the rotational position of the broken conductor detector 308, the orientation vector extends outside of the orientation threshold 310. Accordingly, the broken conductor detector 308 may determine that the conductor 306 is broken if the orientation vector remains extended outside of the orientation threshold 310 for a pre-programmed time threshold. During windy conditions, the orientation vector 312 may swing in and out of the orientation threshold 310; however, the value of the timer may be selected such that windy conditions are not mistakenly identified as a broken conductor. In various embodiments, the timer may be reset when the orientation vector 312 extends outside of the orientation threshold 310.

In various embodiments, the broken conductor detector 308 may comprise rotational position sensors and/or acceleration sensors. As may be appreciated by comparing the orientation of broken conductor detector 308 in FIGS. 3A and 3B, breaking conductor 306 may cause the rotational position of broken conductor detector 308 to change. Such a change in the rotational position may be detected by rotational position sensors. Similarly, when conductor 306 breaks, the broken conductor detector 308 may experience acceleration as it transitions from the position shown in FIG. 3A to the position shown in FIG. 3B. The acceleration of broken conductor detector 308 may be detected by an acceleration sensor disposed within broken conductor detector 308.

Figure 4:
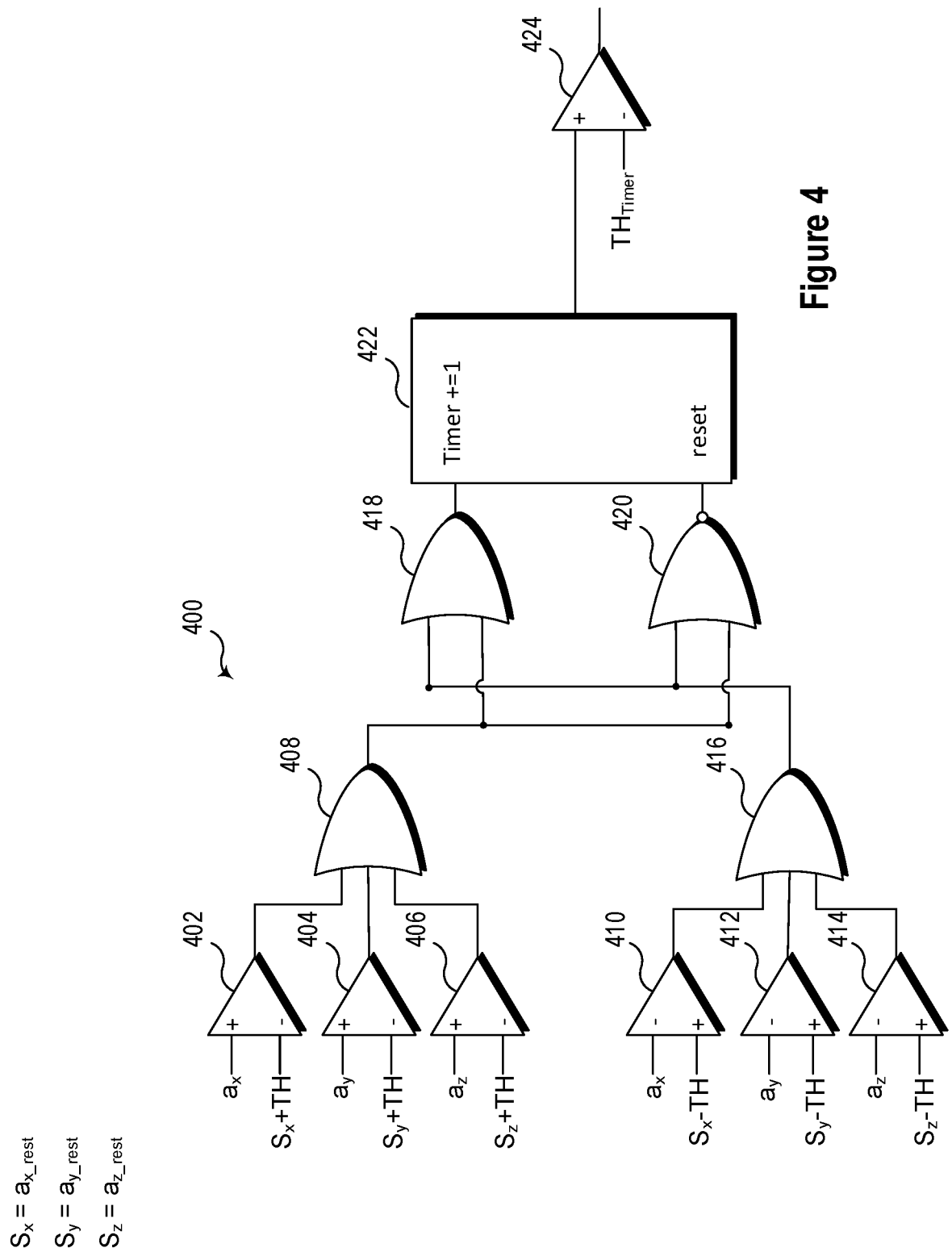
FIG. 4 illustrates a simplified logic diagram of a system configured to utilize a three-axis accelerometer in a broken conductor detector to detect a broken conductor consistent with embodiments of the present disclosure.

FIG. 4 illustrates a simplified logic diagram of a system 400 configured to utilize a three-axis accelerometer in a broken conductor detector to detect a broken conductor consistent with embodiments of the present disclosure. The inputs $a_x$, $a_y$, $a_z$ may represent the detected acceleration in the x, y, and z directions, respectively. A rest acceleration value for each axis (i.e., $a_{x\_rest}$ $a_{y\_rest}$, $a_{z\_rest}$) may be determined during commissioning or during operation. A threshold value (TH) may be established in several ways. For example, the threshold value may be established by a manufacturer as a default setting, may be specified by a user during commissioning, or may be determined based on conductions during operation.

A first plurality of comparators 402, 404, and 406, may determine for each axis whether the measured acceleration values (i.e., $a_x$ $a_y$, $a_z$) exceed the rest acceleration values (i.e., $a_{x\_rest}$ $a_{y\_rest}$, $a_{z\_rest}$) and the threshold value (TH). In some embodiments, the measured acceleration values may be referred to as an operating vector. If the measured acceleration values (i.e., $a_x$ $a_y$, $a_z$) for a respective axis is greater than the rest acceleration values (i.e., $a_{x\_rest}$ $a_{y\_rest}$, $a_{z\_rest}$) and the threshold value (TH), the output of one or more of comparators 402, 404, and 406 may be asserted. The assertion of one or more of comparators 402, 404, and 406 may cause an output or OR gate 408 to assert.

A second plurality of comparators 410, 412, and 414, may determine for each axis whether the measured acceleration values (i.e., $a_x$ $a_y$, $a_z$) are less than the rest acceleration values (i.e., $a_{x\_rest}$ $a_{y\_rest}$, $a_{z\_rest}$) minus the threshold value (TH). In the event that any of the measured acceleration values (i.e., $a_x$ $a_y$, $a_z$) is less than the rest acceleration values (i.e., $a_{x\_rest}$ $a_{y\_rest}$, $a_{z\_rest}$) minus the threshold value (TH), the output of one or more of comparators 410, 412, and 414 may be asserted. The assertion of one or more of comparators 410, 412, and 414 may cause an output or OR gate 416 to assert.

Outputs of OR gates 408 and 416 are provided as inputs to OR gate 418 and NOR gate 420. While the output of OR gate 418 is asserted, a counter 422 continues to increment. Assertion of NOR gate 420 causes the timer 422 to reset. In various embodiments, resetting the timer 422 may signify that the orientation vector has crossed back into the orientation threshold range. Deassertion of OR gate 408 or 416 (signifying the orientation vector is within the orientation threshold) will cause the assertion of NOR gate 420. Assertion of NOR gate 420 will reset timer 422. Timer 422 continually counts up while OR gate 418 is asserted and NOR gat 420 is deasserted and the output is a time value. The output of the timer may be an input to a comparator 424. In the event that the output of the timer exceeds a timer threshold, an output of system 400 may be asserted. The assertion of the output of comparator 424 may indicate a broken conductor. In some embodiments, the detection of a broken conductor may be configured to interrupt the flow of electrical current through the broken conductor.

Figure 5:
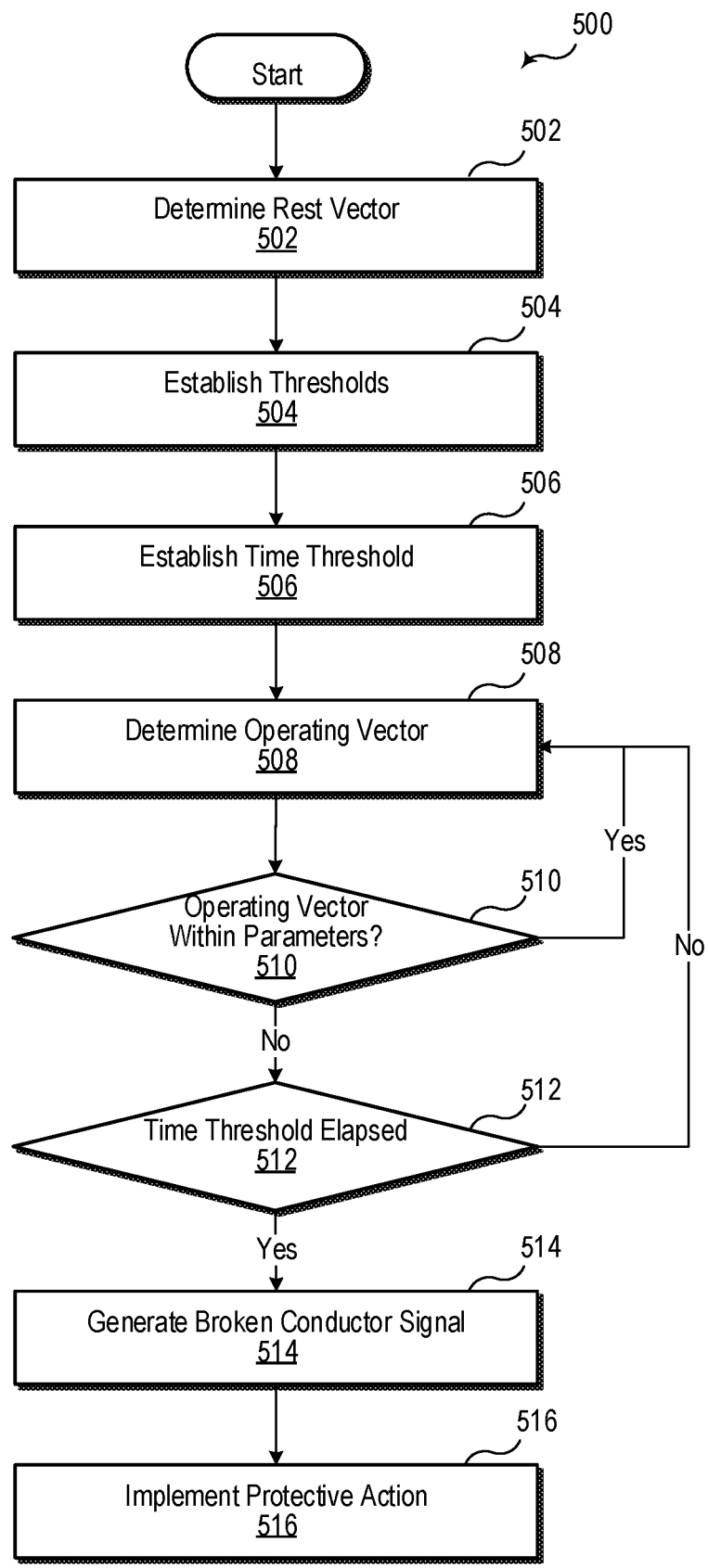
FIG. 5 illustrates a flow chart of a method for detecting a broken conductor consistent with embodiments of the present disclosure.

FIG. 5 illustrates a flow chart of a method 500 for detecting a broken conductor consistent with embodiments of the present disclosure. At 502, a rest orientation vector may be determined. The rest vector may comprise a representation of acceleration and/or rotational position. In some embodiments, the rest vector may be determined during commissioning or during operation. At 504, thresholds may be established. The thresholds may represent acceleration and/or rotational position. At 506, a time threshold may be established. The time threshold may be associated with a timer configured to require that a detected acceleration or change in rotational position be maintained for a period of time. The time threshold may be selected to differentiate between transient conditions (e.g., strong wind gusts) and permanent conditions (e.g., a broken conductor). In some embodiments, the orientation thresholds and time thresholds may be determined by recording data during normal operation for a set time period. The data used to determine the orientation thresholds and time thresholds may be recorded during commissioning of the device. Of course, the data used to determine the orientation thresholds and time thresholds may also be generated after commissioning and/or the thresholds may be adjusted during the life of the device to improve the performance of the broken conductor detector and reduce the likelihood of false detections.

At 508, an operating vector may be determined by a broken conductor detector. In some embodiments, the broken conductor detector may comprise an acceleration sensor and/or a rotational position sensor. At 510, the operating vector may be compared to the thresholds and rest vector to determine whether the operating vector is within parameters. The parameters may be determined using the rest vector and the thresholds. If the operating vector is within the parameters, method 500 may return to 508. If the operating vector is not within the parameters, method 500 may proceed to 512. At 512, method 500 may determine whether a time threshold has elapsed. In some embodiments, a start time may be initialized when method 500 reaches 512, and the start time may be compared to a time threshold. In one specific embodiment, the time threshold may be implemented using timer 422, as illustrated in FIG. 4, and described above. If the time threshold has not elapsed, method 500 may return to 508. If the time threshold has elapsed, a broken conductor signal may be generated at 514. A protective action may be implemented at 516 based on the broken conductor signal. In various embodiments, the protective action may comprise tripping a current interrupting device to deenergize the broken conductor.

Figure 6:
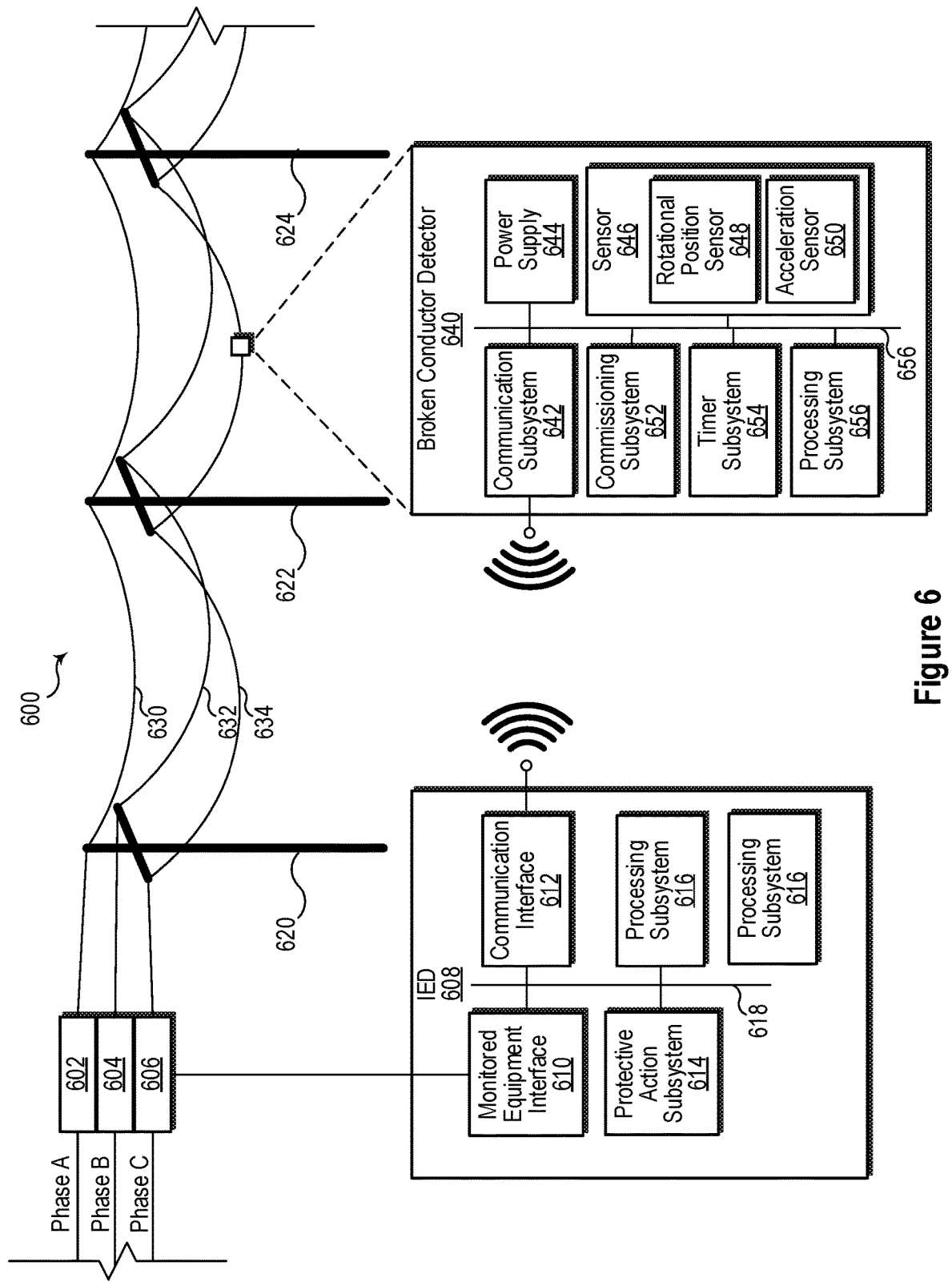
FIG. 6 illustrates a functional block diagram of a system comprising a broken conductor detector consistent with embodiments of the present disclosure.

FIG. 6 illustrates a functional block diagram of a system 600 comprising a broken conductor detector 640 consistent with embodiments of the present disclosure. System 600 may be implemented using hardware, software, firmware, and/or any combination thereof. In the illustrated embodiment, system 600 comprises an IED 608, while in other embodiments, certain components or functions described herein may be associated with other devices or performed by other devices. The specifically illustrated configuration is merely representative of one embodiment consistent with the present disclosure.

System 600 comprises conductors 630, 632, and 634, which are configured to transmit three-phase power. The conductors 630, 632, and 634 span the pylons 620, 622, and 624. Current interrupting devices 602, 604, and 606 may be in electrical communication with the conductors 630, 632, and 634, respectively. In various embodiments, current interrupting devices may comprise reclosers, circuit breakers and the like.

IED 608 may be configured to monitor conductors 630, 632, and 634, and to implement protective actions to ensure the safe transmission of electrical power. In various embodiments, IED 608 may be receive information relating to electrical conductions (e.g., current measurements, etc.) relating to electrical conditions associated with conductors 630, 632, and 634. In addition, IED 608 may be in communication with a broken conductor detector 640. IED 608 may implement protective action based on electrical conditions and/or breakage of conductor 634. A single broken conductor detector 640 is shown on a single span of a single conductor for purposes of simplicity in the illustrated embodiment. In other embodiments, a plurality of broken conductor detectors may be placed on each of conductors 630, 632, and 634 and on multiple spans between pylons 620, 622, and 624.

IED 608 may include a monitored equipment interface 610, a communication interface 612, a protective action subsystem 614, a processing subsystem 616, and a location subsystem 618. A bus 619 may connect the internal elements of IED 608. The monitored equipment interface may be configured to issue commands to and/or receive status information from current interrupting devices 602, 604, and 606. Communication interface 612 may be configured to receive information from broken conductor detector 640. In the illustrated embodiment, the communication interface 612 may be configured to receive a wireless signal from broken conductor detector 640. In various embodiments, the signal may be transmitted using a radio-frequency signal. In various embodiments, communication interface 612 may also permit communication between IED 608 and other devices (not shown) associated with an electrical power system in electrical communication with conductors 630, 632, and 634.

A processing subsystem 616 may be configured to process information received from monitored equipment interface 610 and communication interface 612. Processing subsystem 616 may operate using any number of processing rates and architectures. Processing subsystem 616 may be configured to perform various algorithms and calculations described herein. Processing subsystem 616 may be embodied as a general purpose integrated circuit, an application specific integrated circuit, a field-programmable gate array, and/or any other suitable programmable logic device.

A protective action subsystem 614 may be configured to implement an appropriate protective action based on information from monitored equipment interface 610 and communication interface 612. For example, protective action subsystem may be configured to interrupt the flow of electrical current through conductors 630, 632, and 634 based on a signal from broken conductor detector 640 that conductor 634 is broken. Upon receipt of a signal that a conductor is broken, protective action subsystem 614 may cause monitored equipment interface 610 to interrupt the flow of electrical current through conductors 630, 632, and 634. In some embodiments, current interrupting devices 602, 604, and 606 may be actuated by the protective action subsystem 614. In other embodiments, the protective action subsystem 614 may block or suppress automatic reclosing of current interrupting devices 602, 604, and 606.

A location subsystem 618 may be configured to associate the broken conductor detector 640 with a particular location. In the illustrated embodiment, only a single broken conductor detector 640 is illustrated for simplicity; however, in other embodiments, a large number of broken conductor detectors may be placed throughout an electric power system. A location subsystem 618 may be configured to associate each broken conductor detector with a specific location. Identifying the location of a broken or downed electrical conductor is the first step in repairing the conductor. Accordingly, location subsystem 618 may help to increase the efficiency of locating and repairing a broken conductor.

Broken conductor detector 640 may include a communication subsystem 642, a power supply 644, a sensor 646, a commissioning subsystem 652, a timer subsystem 654, and a processing subsystem 656. A bus 657 may connect the internal elements of broken conductor detector 640. The communication subsystem 642 may be configured to provide a signal when conductor 634 breaks. In some embodiments, communication subsystem 642 may be configured to generate a periodic indication of a status (e.g., a heartbeat signal) of the broken conductor to provide an indication to IED 608 that broken conductor detector 640 continues to function.

The power supply 644 may be configured to provide power to broken conductor detector 640. In some embodiments, power supply 644 may be configured to draw power from conductor 634. In some embodiments, power supply 644 may utilize a current transformer to harvest energy from conductor 634.

The sensor 646 may be configured to detect breakage of conductor 634. In the illustrated embodiment, sensor 646 comprises a rotational position sensor 648 and an acceleration sensor 650. In other embodiments, sensor 646 may comprise only one type of sensor (e.g., either a rotational position sensor or an acceleration sensor). The sensor 646 may be configured to determine an operating vector reflecting the current rotational position and/or acceleration of broken conductor detector 640. The operation vector may be analyzed to determine whether conductor 634 has broken.

The commissioning subsystem 652 may be configured to determine a rest vector that may be compared to an operating vector to determine whether the broken conductor detector is operating within established parameters. In some embodiments, the commissioning subsystem is configured to permit a user to establish various thresholds that may be used, along with measurements from sensor 646, to determine when conductor 634 is broken.

The timer subsystem may be configured to determine whether deviations of the operating vector are transitory or whether the deviations persist for a sufficient duration to indicate that conductor 634 is broken.

The processing subsystem 656 may be configured to utilize information from sensor 646, commissioning subsystem 652, and timer subsystem 654 to determine whether conductor 634 is broken. The processing subsystem 656 may generate a signal to be transmitted to IED 608 by communication subsystem 642 indicating that conductor 634 is broken. In one specific embodiment, processing subsystem 656 may implement method 500, illustrated in FIG. 5.

While specific embodiments and applications of the disclosure have been illustrated and described, it is to be understood that the disclosure is not limited to the specific configurations and components disclosed herein. Accordingly, many changes may be made to the details of the above-described embodiments without departing from the underlying principles of this disclosure. The scope of the present invention should, therefore, be determined only by the following claims.

What is claimed is:

1. A system configured to detect a broken conductor in an electric power system, the system comprising:
   a broken conductor detector configured to couple to an electrical conductor, comprising:
   a first communication subsystem configured to transmit a signal to indicate that the electrical conductor is broken;
   a sensor configured to determine an operating vector;
   a timer subsystem; and
   a processing subsystem in communication with the communication subsystem, the sensor, and the timer subsystem, the processing subsystem configured to:
   receive the operating vector from the sensor;

identify that operating vector is outside of a range defined by a rest vector and a threshold;

determine that the conductor is broken based on the operating vector remaining outside of the range for a period of time determined by the timer subsystem; and generate the signal to be transmitted by the communication subsystem to indicate that the conductor is broken; and an intelligent electronic device, comprising:

a second communication subsystem configured to receive the signal; and a protective action subsystem configured to issue a command to control the electric power system based on the signal;

wherein the command blocks an automatic recloser scheme associated with the broken conductor.

2. The system of claim 1, wherein the threshold comprises a three-dimensional representation.

3. The system of claim 2, wherein the three-dimensional representation comprises a sphere.

4. The broken conductor detector system of claim 1, wherein the first communication subsystem is further configured to transmit to the second communication subsystem a periodic indication of a status of the broken conductor detector in the absence of an event and to confirm that the broken conductor detector remains functional.

5. The broken conductor detector of claim 1, further comprising:

a commissioning subsystem configured to generate the rest vector based on the operating vector at a time of commissioning.

6. The broken conductor detector of claim 1, wherein the sensor comprises an acceleration sensor.

7. The broken conductor detector system of claim 1, further comprising a location subsystem configured to associate each of a plurality of broken conductor detectors with a location in the electric power system.

8. A method for detecting a broken conductor in an electric power system, comprising:

mounting a broken conductor detector to an electrical conductor;

establishing a rest vector;

generating an operating vector using a sensor;

identifying that the operating vector is outside of a range defined by the rest vector and at least one threshold value;

determining that the conductor is broken based on the operating vector remaining outside of the range for a period of time;

transmitting a signal to indicate that the conductor is broken; and issuing a command to control the electric power system based on the signal;

wherein the command comprises blocking an automatic recloser scheme associated with the broken conductor.

9. The method of claim 8, further comprising transmitting a periodic indication of a status of the broken conductor detector.

10. The method of claim 8, further comprising generating the rest vector based on the operating vector at a time of commissioning.

11. The method of claim 8, wherein the sensor comprises an acceleration sensor.

* * * * *